(12) United States Patent
Hsieh

(10) Patent No.: US 6,304,446 B1
(45) Date of Patent: Oct. 16, 2001

(54) HEAT DISSIPATER

(76) Inventor: Hsin-Mao Hsieh, No. 6, East Section, Chiao Nan Li, Industrial 6th Rd., Pingtung City, Pingtung Hsien (TW)

( * ) Notice: Subject to any disclaimer, the term of this patent is extended or adjusted under 35 U.S.C. 154(b) by 0 days.

(21) Appl. No.: 09/651,780

(22) Filed: Aug. 30, 2000

(51) Int. Cl.⁷ .................................................. H05K 7/20
(52) U.S. Cl. ........................ 361/697; 165/80.3; 165/121; 415/213.1
(58) Field of Search .................................. 415/177, 178, 415/213.1, 214.1; 124/16.3; 165/80.3, 120, 121–126; 454/184; 257/722; 312/236; 361/703, 694, 695, 697, 717–719, 722

(56) References Cited

U.S. PATENT DOCUMENTS

| | | | |
|---|---|---|---|
| 5,377,745 | * | 1/1995 | Hsieh ..................................... 165/80.3 |
| 5,940,269 | * | 8/1999 | Ko et al. ................................ 361/697 |
| 5,943,209 | * | 8/1999 | Liu ........................................ 361/695 |
| 6,017,185 | * | 1/2000 | Kuo ....................................... 415/177 |
| 6,053,242 | * | 4/2000 | Hsieh .................................... 165/121 |
| 6,109,340 | * | 8/2000 | Nakase et al. ....................... 165/80.3 |
| 6,118,657 | * | 9/2000 | Clemens ............................... 361/697 |
| 6,137,681 | * | 10/2000 | Lu ........................................ 361/697 |
| 6,160,704 | * | 12/2000 | Rusate ................................. 361/697 |
| 6,186,739 | * | 2/2001 | Hsieh . |

\* cited by examiner

*Primary Examiner*—Gerald Tolin
(74) *Attorney, Agent, or Firm*—Thorp Reed & Armstrong

(57) ABSTRACT

A heat dissipater is composed of a base adapted to engage with a heat source, a fan assembly and a cover. The cover has two perpendicular walls, a central through hole and a path from the central through hole in the cover to the open wall at the edge of the base. With such an arrangement, the air can be directly drawn in from the central through hole and blown out of the cover through the path to dissipate the heat of nearby electronic devices.

12 Claims, 5 Drawing Sheets

HEAT DISSIPATER

BACKGROUND OF THE INVENTION

1. Field of the Invention

The present invention relates to a heat dissipater, and more particularly to a heat dissipater composed of a base, a fan assembly and a cover. The base has multiple fins and the cover has walls formed to correspond to the location of the fins, such that when the fan assembly is in operation, the air can be directed accordingly to dissipate the surrounding heat generated by electronic elements located around the dissipater.

2. Description of Related Art

Heat dissipaters are generally used to dissipate heat generated by electronic devices such as a CPU (Central Processing Unit) or the like. A conventional heat dissipater normally has a base, a fan assembly received in the base and having a fan rotatable in relation to the fan assembly and a cover securely engaged with the base to sandwich the fan assembly between the base and the cover. The cover has four walls each engaged with one of the edges of the base, such that after assembly of the base and the cover, the air can only be directed from the central opening of the cover either away from or to the electronic device so that the heat is dissipated through the gaps between the fins. The path of the air in this kind of heat dissipater is fixed and does not serve other electronic devices around the dissipated one. Furthermore, because plug-in type electronic devices can be added any time the user wants, the arrangement of the electronic devices changes. To accommodate the heat dissipation problem corresponding to the frequent changes in the location of electronic devices, the conventional heat dissipater must be changed to meet the requirements of the users.

It is therefore necessary to provide an improved heat dissipater to overcome the aforementioned problems.

SUMMARY OF THE INVENTION

The primary objective of the invention is to provide an improved heat dissipater having a cover with walls adapted to cope with various configurations of electronic devices to increase the heat dissipation efficiency to other electronic devices.

Other objects, advantages and novel features of the invention will become more apparent from the following detailed description when taken in conjunction with the accompanying drawings.

DETAILED DESCRIPTION OF PREFERRED EMBODIMENT

Figure 1:
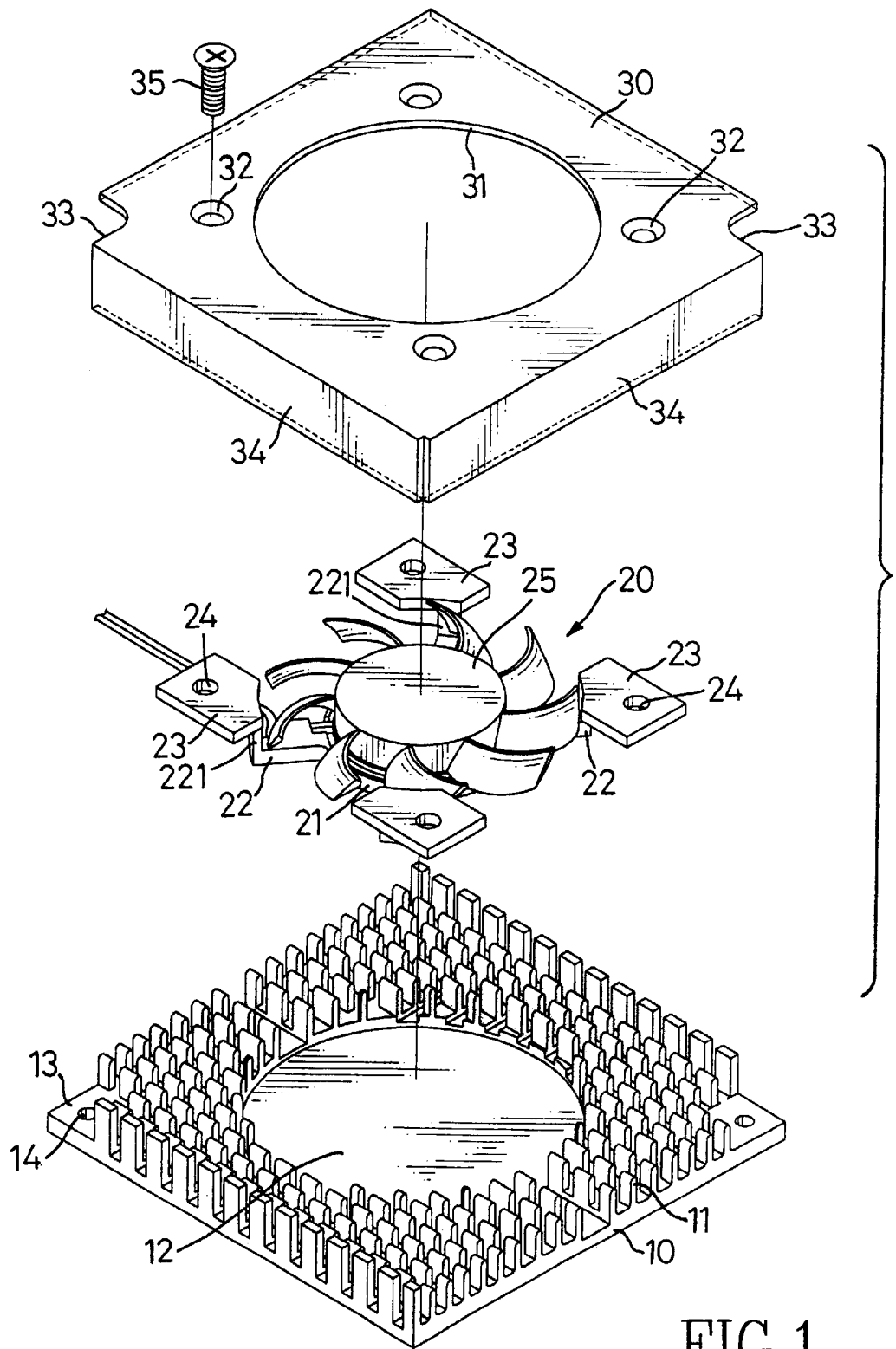
FIG. 1 is an exploded perspective view of the heat dissipater in accordance with the present invention.

With reference to FIG. 1, a heat dissipater in accordance with the present invention is composed of a base (10), a fan assembly (20) and a cover (30).

The base (10) has multiple fins (11) formed on the top face, a central through hole (12) and multiple corners (13) with no fins (11) and a through hole (14) in said corners (13) configured to be connected with a heat source, for example a CPU.

The fan assembly (20) has a support (21), a fan (25) and multiple legs (22). The fan (25) is rotatably mounted on the support (21). The legs (22) are integrally formed with and extending out from the support (21) and have a step (221) extending up from the free end of the legs (22). A plate (23) with a first screw hole (24) is formed at the distal end of each of the steps (221).

The cover (30) has a central hole (31), multiple second screw holes (32), cutouts (33) and two walls (34). The central hole (31) corresponds to the through hole (12) in the base (10). The second screw holes (32) correspond to the first screw holes (24) in the fan assembly (20). The cutouts (33) correspond to the corners (13) of the base (10) with through holes (12) to allow access to the screws (not shown) that attach the base (10) to the electronic device (not shown). The two walls (34) extend perpendicular from the edge of the face with the central hole (31).

Figure 2:
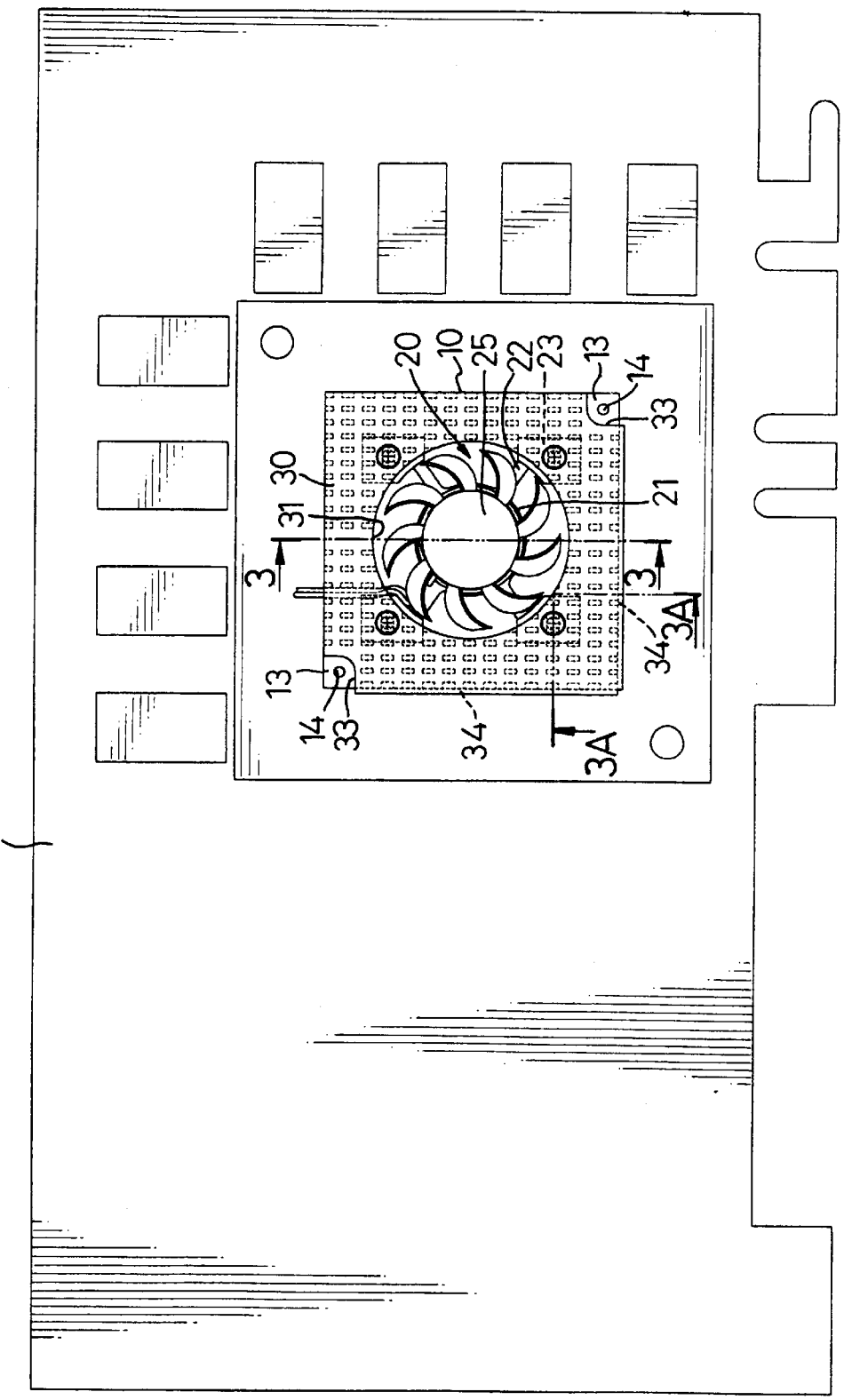
FIG. 2 is a top plan view of the heat dissipater in FIG. 1.
Figure 3:
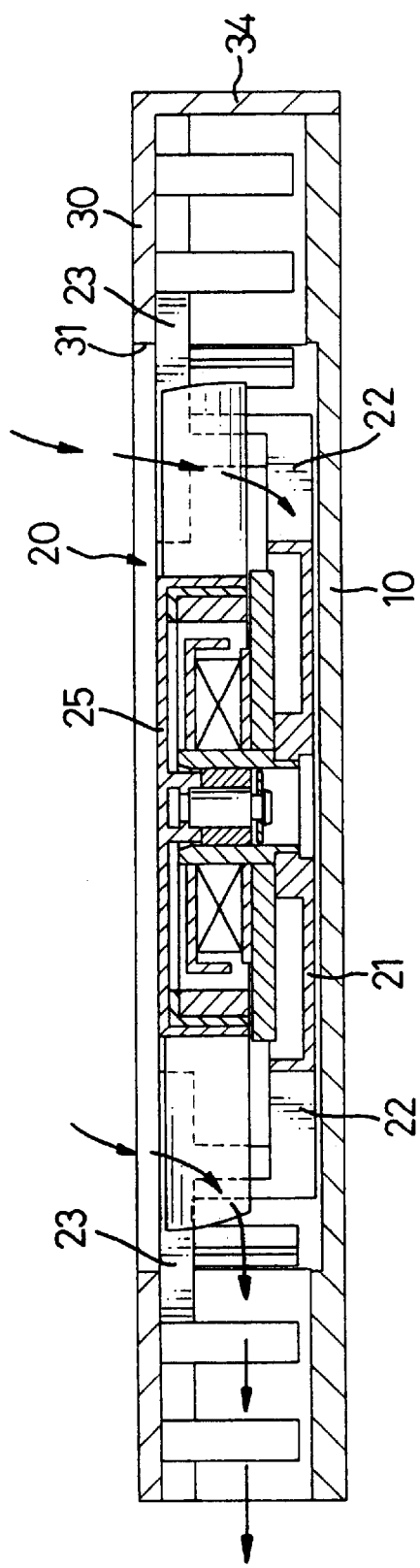
FIG. 3 is a cross sectional side plan view of the heat dissipater in FIG. 2 showing the air flow.
Figure 3A:
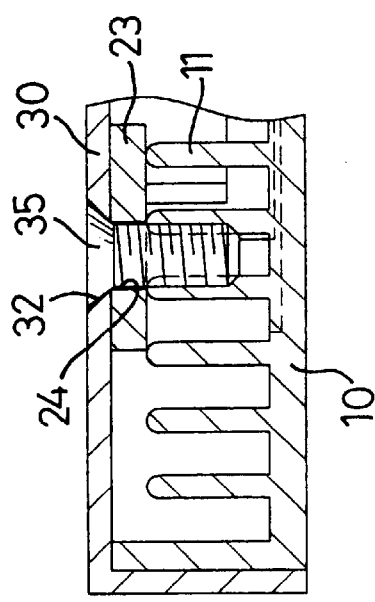
FIG. 3A is a cross sectional side plan view of the heat dissipater along the segment of line 3A—3A in FIG. 2 that passes through the screw.

With reference to FIGS. 2 and 3A, when the heat dissipater is assembled, the cover (30) and the fan assembly (20) are attached to the base (10) by screws (35) inserted through the aligned first screw holes (24) and second screw holes (32) and into the gap between two adjacent fins (11) on the base (10).

With reference to FIG. 3, after the assembly of the heat dissipator, the air flows through sides of the cover (30) without walls (34). Therefore, the heat generated by electronic elements on the sides of the heat dissipater without cover (30) walls (34) can also be dissipated efficiently.

Figure 4:
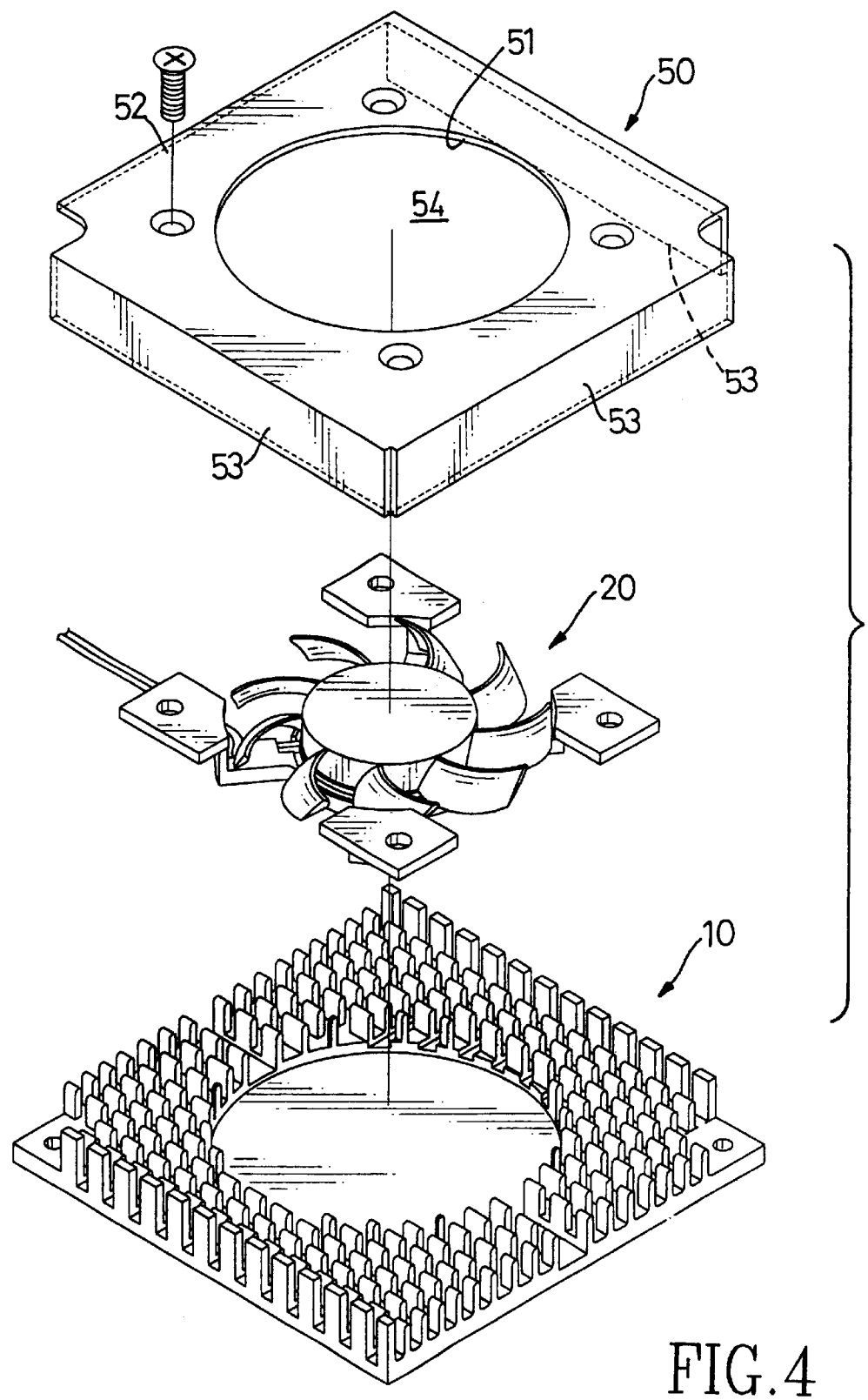
FIG. 4 is an exploded perspective view of another preferred embodiment of the heat dissipater in accordance with the present invention.

With reference to FIG. 4, another preferred embodiment of the heat dissipater is composed of a base (10), a fan assembly (20) and a cover (50). Because the structure of the base (10) and the fan assembly (20) are the same as that described in FIG. 1, the same elements are designated with the same reference numerals, and thus detailed description is omitted. The cover (50) has a central opening (51), multiple second screw holes (52) defined to correspond to the first screw holes (24) in the fan assembly (20) plates (23) and three walls (53) extending perpendicular from the face defining the central opening (51), a path (54) is defined by the three walls (53) from the central opening (51) through the fan assembly (20) and the open side of the heat dissipater. When the heat dissipater is assembled, the air flows in through the central opening (51) to remove the heat from the heat source and then direct the flow of hot air out of the heat dissipater to simultaneously remove heat from nearby electronic devices in the path (54).

Figure 5:
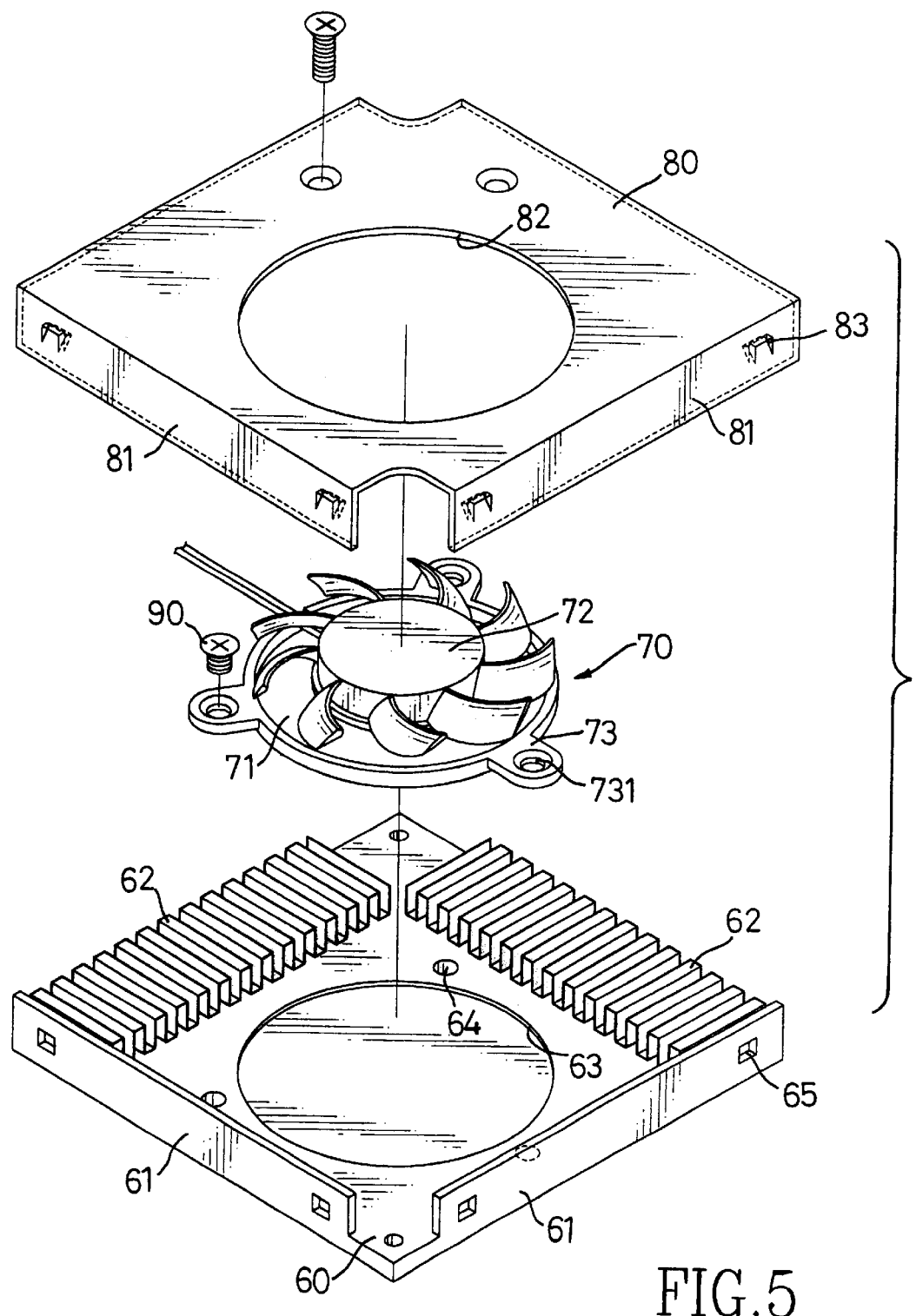
FIG. 5 is an exploded perspective view of still another preferred embodiment of the heat dissipater in accordance with the present invention.

With reference to FIG. 5, another preferred embodiment of the heat dissipater in accordance with the present invention has a base (60), a fan assembly (70) and a cover (80).

The base (60) has two first walls (61) perpendicular to the base (60), a row of fins (62) on each edge that has no first wall (61) and a central through hole (63).

The fan assembly (70) has a support (71) to rotatably receive a fan (72). The support has three legs (73) with an opening (731) defined in each leg (73) to correspond to three threaded holes (64) in the base (60). With such an arrangement, the fan assembly (70) is able to be securely mounted in the base (60) with bolts (90) respectively inserted into openings (731) aligned with the threaded holes (64).

The cover (80) has two second walls (81), a central through hole (82) and two pairs of snaps (83). The two second walls (81) correspond to the two first walls (61) on the base (60). The central through hole (82) corresponds to the through hole (63) in the base (60). A pair of snaps (83) is formed on the inside face of each of the two second walls (81) to correspond to two pairs of notches (65) defined in the outside face of each of the two first walls (61). With such an arrangement, the cover (80) is able to securely engage with the base (60), and the air can then be directed directly in from the central through hole (82) and blown out of the heat dissipater through the two rows of fins (62). Accordingly, the heat from nearby electronic devices can be dissipated efficiently.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A heat dissipater adapted for heat dissipation from a heat source, the heat dissipater comprising:

a base configured to engage with the heat source and having multiple fins integrally formed on the base, corners adapted to be engaged with the heat source, and a central through hole;

a fan assembly having a support to rotatably receive a fan, multiple legs integrally extending out from the support and each leg provided with a step and a plate that is formed on the free end of the step; and a cover securely engaged with the base to sandwich the fan assembly between the cover and the base and having a central through hole corresponding to the through hole in the base, two walls and two paths communicating with the central through hole.

2. The heat dissipater as claimed in claim 1, the fins are arranged in two rows each being located on one of the paths.

3. The heat dissipater as claimed in claim 1, wherein a first screw hole is defined in each of the plates and multiple screw holes are defined in the cover to correspond with the first screw holes so as to allow the fan assembly to securely engage with the cover by bolts.

4. The heat dissipater as claimed in claim 3, wherein multiple cutouts are defined in the cover to correspond to corners of the base.

5. A heat dissipater adapted for heat dissipation from a heat source, the heat dissipater comprising:

a base configured to engage with the heat source and having multiple fins integrally formed on the base, corners adapted to be engaged with the heat source, and a central through hole;

a fan assembly securely engaged with the base and having a support to rotatably receive a fan, multiple legs integrally extending out from the support and each leg provided with a step and a plate that is formed on a free end of the step; and a cover securely engaged with the base to sandwich the fan assembly between the cover and the base and having a central through hole corresponding to the through hole in the base, two walls and two paths communicating with the central through hole.

6. The heat dissipater as claimed in claim 5, wherein the fins are arranged in two rows each being located on one of the paths.

7. The heat dissipater as claimed in claim 5, wherein each of the two walls of the cover has a snap and the base has two walls each corresponding to one of the cover and each of which is provided with a notch defined to correspond to the snap.

8. The heat dissipater as claimed in claim 5, wherein multiple cutouts are defined in the cover to correspond to the corners of the base.

9. A heat dissipater adapted for heat dissipation from a heat source, the heat dissipater comprising:

a base configured to engage with the heat source and having multiple fins integrally formed on the base, corners adapted to be engaged with the heat source, and a central through hole;

a fan assembly securely engaged with the base and having a support to rotatably receive a fan, multiple legs integrally extending out from the support and each leg provided with a step and a plate that is formed on a free end of the step; and a cover securely engaged with the base to sandwich the fan assembly between the cover and the base and having a central through hole corresponding to the through hole in the base, three walls and a path communicating with the central through hole.

10. The heat dissipater as claimed in claim 9, wherein the fins are arranged in two rows each being located on the path.

11. The heat dissipater as claimed in claim 9, wherein each of the walls of the cover has a snap and the base has walls each corresponding to one of the walls of the cover and each of which is provided with a notch defined to correspond to the snap.

12. The heat dissipater as claimed in claim 9, wherein multiple cutouts are defined in the cover to correspond to the corners of the base.

* * * * *